United States Patent
Sforzin et al.

(10) Patent No.: US 11,742,047 B2
(45) Date of Patent: Aug. 29, 2023

(54) SHARED ERROR CORRECTION CODING CIRCUITRY

(71) Applicant: Micron Technology, Inc., Boise, ID (US)

(72) Inventors: Marco Sforzin, Cernusco Sul Naviglio (IT); Paolo Amato, Treviglio (IT); Christophe Vincent Antoine Laurent, Agrate Brianza (IT)

(73) Assignee: Micron Technology, Inc., Boise, ID (US)

( * ) Notice: Subject to any disclaimer, the term of this patent is extended or adjusted under 35 U.S.C. 154(b) by 119 days.

(21) Appl. No.: 17/361,419

(22) Filed: Jun. 29, 2021

(65) Prior Publication Data
US 2022/0415426 A1 Dec. 29, 2022

(51) Int. Cl.
*G11C 29/42* (2006.01)
*G11C 29/56* (2006.01)
*G11C 29/44* (2006.01)

(52) U.S. Cl.
CPC ........... *G11C 29/42* (2013.01); *G11C 29/44* (2013.01); *G11C 29/56008* (2013.01); *G11C 29/56016* (2013.01)

(58) Field of Classification Search
CPC ... G11C 29/56016; G11C 29/42; G11C 29/44; G11C 29/56008
See application file for complete search history.

(56) References Cited

U.S. PATENT DOCUMENTS

| | | | | |
|---|---|---|---|---|
| 6,704,371 | B1* | 3/2004 | Hishiki | H03M 13/6575 375/346 |
| 11,204,826 | B2* | 12/2021 | Noguchi | G11C 29/025 |
| 11,340,984 | B2* | 5/2022 | Nakanishi | G11C 7/1048 |
| 2014/0013183 | A1* | 1/2014 | Sohn | G06F 11/1048 714/763 |
| 2014/0101513 | A1* | 4/2014 | Kim | G06F 11/1004 714/758 |
| 2020/0192754 | A1* | 6/2020 | Cho | G11C 29/52 |
| 2021/0249097 | A1* | 8/2021 | Fujishiro | G11C 11/4093 |
| 2022/0261310 | A1* | 8/2022 | Ishikawa | G06F 11/1048 |
| 2022/0399902 | A1* | 12/2022 | Geiger | G06F 11/1076 |

* cited by examiner

*Primary Examiner* — Tuan T Nguyen
(74) *Attorney, Agent, or Firm* — Holland & Hart LLP

(57) ABSTRACT

Methods, systems, and devices for shared error correction coding (ECC) circuitry are described. For example, a memory device configured with shared ECC circuitry may be configured to receive data at the shared circuitry from either a host device or a set of memory cells of the memory device. The shared circuitry may be configured to generate a set of multiple syndromes associated with a cyclic error correction code, based on the received data. As part of an encoding process, an encoder circuit may generate a set of parity bits based on the generated syndromes. As part of a decoding process, a decoder circuit may generate an error vector for decoding the received data, based on the generated syndromes. The decoder circuit may also correct one or more errors in the received data based on generating the error vector.

23 Claims, 6 Drawing Sheets

US 11,742,047 B2

SHARED ERROR CORRECTION CODING CIRCUITRY

FIELD OF TECHNOLOGY

The following relates generally to one or more systems for memory and more specifically to shared error correction coding (ECC) circuitry.

BACKGROUND

Memory devices are widely used to store information in various electronic devices such as computers, user devices, wireless communication devices, cameras, digital displays, and the like. Information is stored by programing memory cells within a memory device to various states. For example, binary memory cells may be programmed to one of two supported states, often denoted by a logic 1 or a logic 0. In some examples, a single memory cell may support more than two states, any one of which may be stored. To access the stored information, a component may read, or sense, at least one stored state in the memory device. To store information, a component may write, or program, the state in the memory device.

Various types of memory devices and memory cells exist, including magnetic hard disks, random access memory (RAM), read-only memory (ROM), dynamic RAM (DRAM), synchronous dynamic RAM (SDRAM), static RAM (SRAM), ferroelectric RAM (FeRAM), magnetic RAM (MRAM), resistive RAM (RRAM), flash memory, phase change memory (PCM), self-selecting memory, chalcogenide memory technologies, and others. Memory cells may be volatile or non-volatile. Non-volatile memory, e.g., FeRAM, may maintain their stored logic state for extended periods of time even in the absence of an external power source. Volatile memory devices, e.g., DRAM, may lose their stored state when disconnected from an external power source.

DETAILED DESCRIPTION

Figure 1:
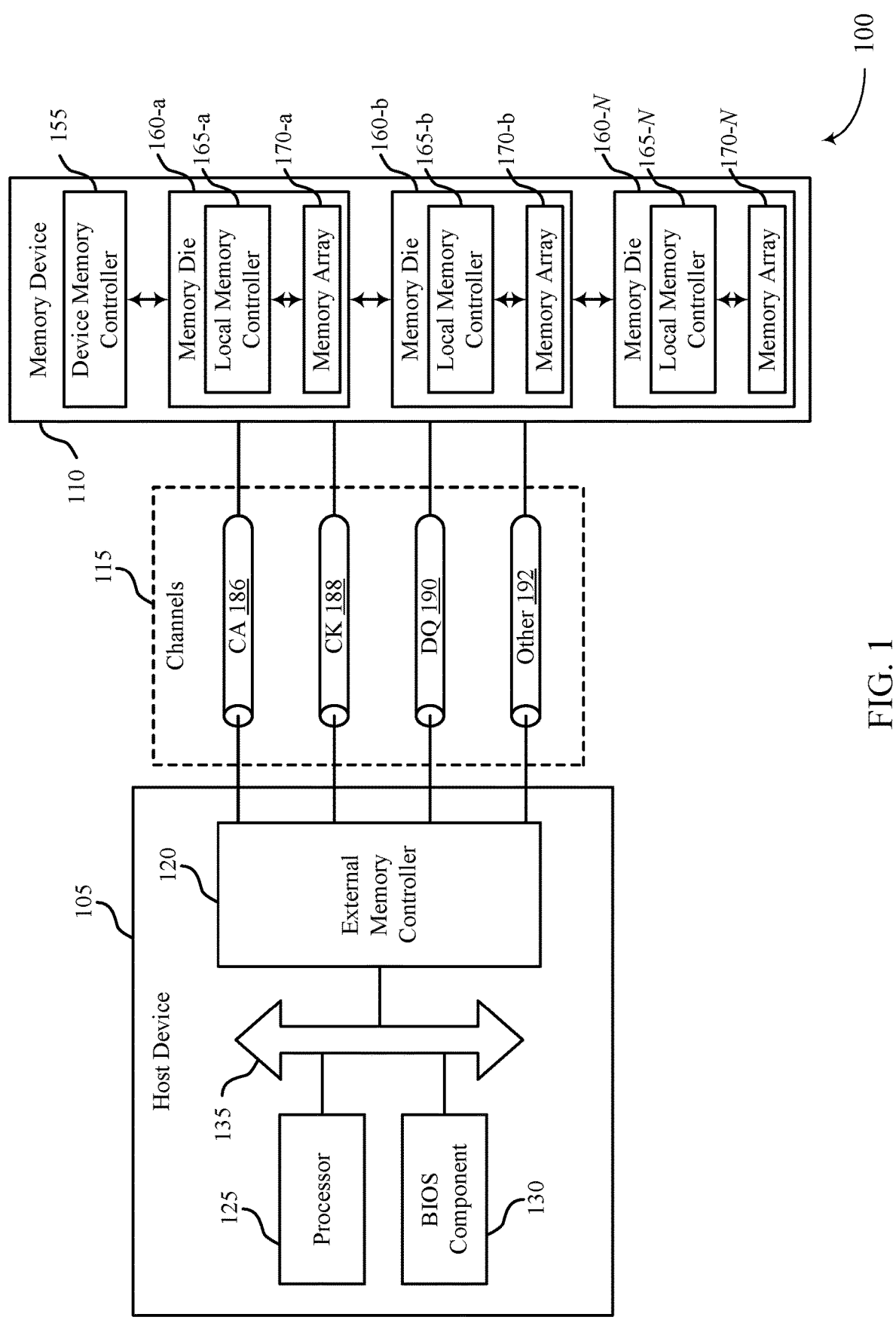
FIG. 1 illustrates an example of a system that supports shared error correction coding (ECC) circuitry in accordance with examples as disclosed herein.

A memory device may include error correction coding circuitry configured to perform coding operations (e.g., encoding or decoding) on data received from a host device and stored at the memory device. One example coding scheme is a Bose-Chaudhuri-Hocquenghem (BCH) code, which may be implemented with varying levels of error correction capability. For example, a BCH2 code may correct up to two errors in a set of data bits (e.g., a data vector). In some cases, circuitry for a BCH2 encoder and circuitry for a BCH2 decoder (e.g., among other encoder and decoder circuitry) may be separate from one another (e.g., may include separate or different circuits of the memory device for encoding and decoding). For example, the BCH2 encoder may be configured to encode data for storage at the memory device (e.g., for a data path associated with storing data) and the BCH2 decoder may be configured to decode data after the data is stored and accessed at the memory device (e.g., for a data path associated with reading data), where the transmission data path and the reception data path may use different circuitry (or portions of a device). In some cases, the separate or different circuitry for the encoder and the decoder may result in a relatively large area occupied by the error correction coding circuitry, which may increase manufacturing complexity, manufacturing costs, and may increase a device size.

The present disclosure provides techniques for the memory device to use a portion of the decoder circuitry as a portion of the encoder circuitry. For example, the error correction coding circuitry may include a shared portion that generates one or more syndromes (e.g., error checking vectors based on data input to the error correction coding circuitry) based on received or stored data. The error correction coding circuitry may generate the syndrome(s) using one or more coding matrices, and may use the syndrome(s) in subsequent circuit-specific coding processes. For example, the syndrome(s) may be used by encoder-specific circuitry to generate a set of parity bits for encoding the data (e.g., when the data is received by the memory device for storage at the memory device), where the set of parity bits may be generated by effectively multiplying the syndrome(s) with an encoder matrix. The syndrome(s) may additionally or alternatively be used by decoder-specific circuitry to generate an error vector and error corrections (e.g., when the data is accessed after being stored at the memory device), for example, in order to correct errors in the stored data. Thus, a portion of the circuitry for encoding and decoding may be shared, which may reduce manufacturing complexity and costs, as well as a device size. Although some aspects described herein are with reference to a DRAM system, the techniques, systems, and devices as described herein may be applicable to any system (e.g., memory system, type of memory) that implements error correction encoding and decoding.

Features of the disclosure are initially described in the context of systems and dies as described with reference to FIGS. 1 and 2. Aspects of the disclosure are then described in the context of a circuit diagram and a flow diagram as described with reference to FIGS. 3 and 4. These and other features of the disclosure are further illustrated by and described with reference to an apparatus diagram and flowcharts that relate to shared error correction coding (ECC) circuitry as described with reference to FIGS. 5 and 6.

FIG. 1 illustrates an example of a system 100 that supports shared ECC circuitry in accordance with examples as disclosed herein. The system 100 may include a host device 105, a memory device 110, and a plurality of channels 115 coupling the host device 105 with the memory device 110. The system 100 may include one or more memory devices 110, but aspects of the one or more memory devices 110 may be described in the context of a single memory device (e.g., memory device 110). Although described with reference to a DRAM system, the techniques, systems, and devices as described herein may be applicable to any system that implements error correction encoding and decoding.

The system 100 may include portions of an electronic device, such as a computing device, a mobile computing device, a wireless device, a graphics processing device, a vehicle, or other systems. For example, the system 100 may illustrate aspects of a computer, a laptop computer, a tablet computer, a smartphone, a cellular phone, a wearable device, an internet-connected device, a vehicle controller, or the like. The memory device 110 may be a component of the system operable to store data for one or more other components of the system 100.

At least portions of the system 100 may be examples of the host device 105. The host device 105 may be an example of a processor or other circuitry within a device that uses memory to execute processes, such as within a computing device, a mobile computing device, a wireless device, a graphics processing device, a computer, a laptop computer, a tablet computer, a smartphone, a cellular phone, a wearable device, an internet-connected device, a vehicle controller, a system on a chip (SoC), or some other stationary or portable electronic device, among other examples. In some examples, the host device 105 may refer to the hardware, firmware, software, or a combination thereof that implements the functions of an external memory controller 120. In some examples, the external memory controller 120 may be referred to as a host or a host device 105.

A memory device 110 may be an independent device or a component that is operable to provide physical memory addresses/space that may be used or referenced by the system 100. In some examples, a memory device 110 may be configurable to work with one or more different types of host devices. Signaling between the host device 105 and the memory device 110 may be operable to support one or more of: modulation schemes to modulate the signals, various pin configurations for communicating the signals, various form factors for physical packaging of the host device 105 and the memory device 110, clock signaling and synchronization between the host device 105 and the memory device 110, timing conventions, or other factors.

The memory device 110 may be operable to store data for the components of the host device 105. In some examples, the memory device 110 may act as a secondary-type or dependent-type device to the host device 105 (e.g., responding to and executing commands provided by the host device 105 through the external memory controller 120). Such commands may include one or more of a write command for a write operation, a read command for a read operation, a refresh command for a refresh operation, or other commands.

The host device 105 may include one or more of an external memory controller 120, a processor 125, a basic input/output system (BIOS) component 130, or other components such as one or more peripheral components or one or more input/output controllers. The components of the host device 105 may be coupled with one another using a bus 135.

The processor 125 may be operable to provide control or other functionality for at least portions of the system 100 or at least portions of the host device 105. The processor 125 may be a general-purpose processor, a digital signal processor (DSP), an application-specific integrated circuit (ASIC), a field-programmable gate array (FPGA) or other programmable logic device, discrete gate or transistor logic, discrete hardware components, or a combination of these components. In such examples, the processor 125 may be an example of a central processing unit (CPU), a graphics processing unit (GPU), a general purpose GPU (GPGPU), or an SoC, among other examples. In some examples, the external memory controller 120 may be implemented by or be a part of the processor 125.

The BIOS component 130 may be a software component that includes a BIOS operated as firmware, which may initialize and run various hardware components of the system 100 or the host device 105. The BIOS component 130 may also manage data flow between the processor 125 and the various components of the system 100 or the host device 105. The BIOS component 130 may include a program or software stored in one or more of read-only memory (ROM), flash memory, or other non-volatile memory.

In some examples, the system 100 or the host device 105 may include various peripheral components. The peripheral components may be any input device or output device, or an interface for such devices, that may be integrated into or with the system 100 or the host device 105. Examples may include one or more of: a disk controller, a sound controller, a graphics controller, an Ethernet controller, a modem, a universal serial bus (USB) controller, a serial or parallel port, or a peripheral card slot such as peripheral component interconnect (PCI) or specialized graphics ports. The peripheral component(s) may be other components understood by a person having ordinary skill in the art as a peripheral.

The memory device 110 may include a device memory controller 155 and one or more memory dies 160 (e.g., memory chips) to support a desired capacity or a specified capacity for data storage. Each memory die 160 (e.g., memory die 160-*a*, memory die 160-*b*, memory die 160-N) may include a local memory controller 165 (e.g., local memory controller 165-*a*, local memory controller 165-*b*, local memory controller 165-N) and a memory array 170 (e.g., memory array 170-*a*, memory array 170-*b*, memory array 170-N). A memory array 170 may be a collection (e.g., one or more grids, one or more banks, one or more tiles, one or more sections) of memory cells, with each memory cell being operable to store at least one bit of data. A memory device 110 including two or more memory dies 160 may be referred to as a multi-die memory or a multi-die package or a multi-chip memory or a multi-chip package.

The memory die 160 may be an example of a two-dimensional (2D) array of memory cells or may be an example of a three-dimensional (3D) array of memory cells. A 2D memory die 160 may include a single memory array 170. A 3D memory die 160 may include two or more memory arrays 170, which may be stacked on top of one another or positioned next to one another (e.g., relative to a substrate). In some examples, memory arrays 170 in a 3D memory die 160 may be referred to as decks, levels, layers, or dies. A 3D memory die 160 may include any quantity of stacked memory arrays 170 (e.g., two high, three high, four high, five high, six high, seven high, eight high). In some 3D memory dies 160, different decks may share at least one common access line such that some decks may share one or more of a word line, a digit line, or a plate line.

The device memory controller 155 may include circuits, logic, or components operable to control operation of the memory device 110. The device memory controller 155 may include the hardware, the firmware, or the instructions that enable the memory device 110 to perform various operations and may be operable to receive, transmit, or execute commands, data, or control information related to the components of the memory device 110. The device memory controller 155 may be operable to communicate with one or more of the external memory controller 120, the one or more memory dies 160, or the processor 125. In some examples, the device memory controller 155 may control operation of the memory device 110 described herein in conjunction with the local memory controller 165 of the memory die 160.

In some examples, the memory device 110 may receive data or commands or both from the host device 105. For example, the memory device 110 may receive a write command indicating that the memory device 110 is to store data for the host device 105 or a read command indicating that the memory device 110 is to provide data stored in a memory die 160 to the host device 105.

A local memory controller 165 (e.g., local to a memory die 160) may include circuits, logic, or components operable to control operation of the memory die 160. In some examples, a local memory controller 165 may be operable to communicate (e.g., receive or transmit data or commands or both) with the device memory controller 155. In some examples, a memory device 110 may not include a device memory controller 155, and a local memory controller 165 or the external memory controller 120 may perform various functions described herein. As such, a local memory controller 165 may be operable to communicate with the device memory controller 155, with other local memory controllers 165, or directly with the external memory controller 120, or the processor 125, or a combination thereof. Examples of components that may be included in the device memory controller 155 or the local memory controllers 165 or both may include receivers for receiving signals (e.g., from the external memory controller 120), transmitters for transmitting signals (e.g., to the external memory controller 120), decoders for decoding or demodulating received signals, encoders for encoding or modulating signals to be transmitted, or various other circuits or controllers operable for supporting described operations of the device memory controller 155 or local memory controller 165 or both.

The external memory controller 120 may be operable to enable communication of one or more of information, data, or commands between components of the system 100 or the host device 105 (e.g., the processor 125) and the memory device 110. The external memory controller 120 may convert or translate communications exchanged between the components of the host device 105 and the memory device 110. In some examples, the external memory controller 120 or other component of the system 100 or the host device 105, or its functions described herein, may be implemented by the processor 125. For example, the external memory controller 120 may be hardware, firmware, or software, or some combination thereof implemented by the processor 125 or other component of the system 100 or the host device 105. Although the external memory controller 120 is depicted as being external to the memory device 110, in some examples, the external memory controller 120, or its functions described herein, may be implemented by one or more components of a memory device 110 (e.g., a device memory controller 155, a local memory controller 165) or vice versa.

The components of the host device 105 may exchange information with the memory device 110 using one or more channels 115. The channels 115 may be operable to support communications between the external memory controller 120 and the memory device 110. Each channel 115 may be examples of transmission mediums that carry information between the host device 105 and the memory device. Each channel 115 may include one or more signal paths or transmission mediums (e.g., conductors) between terminals associated with the components of the system 100. A signal path may be an example of a conductive path operable to carry a signal. For example, a channel 115 may include a first terminal including one or more pins or pads at the host device 105 and one or more pins or pads at the memory device 110. A pin may be an example of a conductive input or output point of a device of the system 100, and a pin may be operable to act as part of a channel.

Channels 115 (and associated signal paths and terminals) may be dedicated to communicating one or more types of information. For example, the channels 115 may include one or more command and address (CA) channels 186, one or more clock signal (CK) channels 188, one or more data (DQ) channels 190, one or more other channels 192, or a combination thereof. In some examples, signaling may be communicated over the channels 115 using single data rate (SDR) signaling or double data rate (DDR) signaling. In SDR signaling, one modulation symbol (e.g., signal level) of a signal may be registered for each clock cycle (e.g., on a rising or falling edge of a clock signal). In DDR signaling, two modulation symbols (e.g., signal levels) of a signal may be registered for each clock cycle (e.g., on both a rising edge and a falling edge of a clock signal).

In some examples, CA channels 186 may be operable to communicate commands between the host device 105 and the memory device 110 including control information associated with the commands (e.g., address information). For example, commands carried by the CA channel 186 may include a read command with an address of the desired data. In some examples, a CA channel 186 may include any quantity of signal paths to decode one or more of address or command data (e.g., eight or nine signal paths).

In some examples, clock signal channels 188 may be operable to communicate one or more clock signals between the host device 105 and the memory device 110. Each clock signal may be operable to oscillate between a high state and a low state, and may support coordination (e.g., in time) between actions of the host device 105 and the memory device 110. In some examples, the clock signal may be single ended. In some examples, the clock signal may provide a timing reference for command and addressing operations for the memory device 110, or other system-wide operations for the memory device 110. A clock signal therefore may be referred to as a control clock signal, a command clock signal, or a system clock signal. A system clock signal may be generated by a system clock, which may include one or more hardware components (e.g., oscillators, crystals, logic gates, transistors).

In some examples, data channels 190 may be operable to communicate one or more of data or control information between the host device 105 and the memory device 110. For example, the data channels 190 may communicate information (e.g., bi-directional) to be written to the memory device 110 or information read from the memory device 110.

The channels 115 may include any quantity of signal paths (including a single signal path). In some examples, a channel 115 may include multiple individual signal paths. For example, a channel may be ×4 (e.g., including four signal paths), ×8 (e.g., including eight signal paths), ×16 (including sixteen signal paths), etc.

In some examples, the one or more other channels 192 may include one or more error detection code (EDC) channels. The EDC channels may be operable to communicate error detection signals, such as checksums, to improve system reliability. An EDC channel may include any quantity of signal paths.

In some examples, the memory device 110 may include error correction coding circuitry configured to perform coding operations (e.g., encoding or decoding) on data received from the host device 105, data stored at the memory device 110, among other means of receiving data. In some cases, the memory device 110 may be configured with separate encoding circuitry and decoding circuitry. The separate circuitry of an encoder circuit and a decoder circuit may result in a relatively large area occupied by the error correction coding circuitry, which may increase manufacturing complexity, manufacturing costs, and may increase a device size.

According to various aspects described herein, the memory device 110 may be configured to use a portion of the decoder circuitry as a portion of the encoder circuitry (e.g., a portion of the circuitry for encoding and decoding may be shared), which may reduce manufacturing complexity and costs, as well as a device size. The shared circuitry (e.g., circuitry shared between the encoding and decoding circuits) may generate one or more syndromes based on received data (e.g., received from a host device 105 via a channel 115) or based on accessing stored data (e.g., stored at one or more memory dies 160), among other examples of receiving data at error correction circuitry. The memory device 110 may use the syndrome(s) in subsequent circuit-specific coding processes. For example, the syndrome(s) may be used by encoder-specific circuitry to generate a set of parity bits for the data (e.g., when receiving data for storage), or may be used by decoder-specific circuitry to generate an error vector for correcting errors in stored data (e.g., when accessing stored data).

Figure 2:
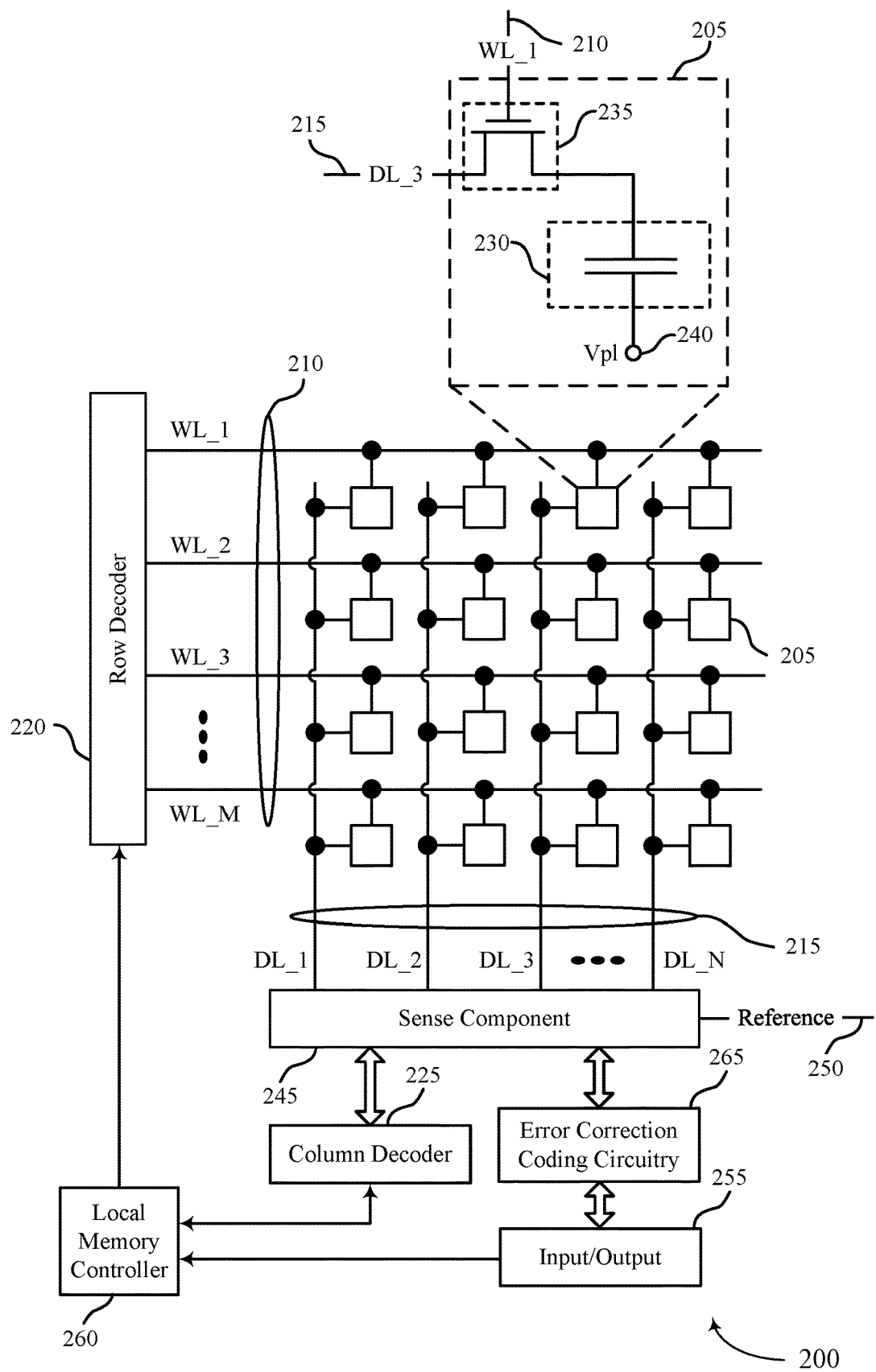
FIG. 2 illustrates an example of a memory die that supports shared ECC circuitry in accordance with examples as disclosed herein.

FIG. 2 illustrates an example of a memory die 200 that supports shared ECC circuitry in accordance with examples as disclosed herein. The memory die 200 may be an example of the memory dies 160 described with reference to FIG. 1. In some examples, the memory die 200 may be referred to as a memory chip, a memory device, or an electronic memory apparatus. The memory die 200 may include one or more memory cells 205 that may each be programmable to store different logic states (e.g., programmed to one of a set of two or more possible states). For example, a memory cell 205 may be operable to store one bit of information at a time (e.g., a logic 0 or a logic 1). In some examples, a memory cell 205 (e.g., a multi-level memory cell) may be operable to store more than one bit of information at a time (e.g., a logic 00, logic 01, logic 10, a logic 11). In some examples, the memory cells 205 may be arranged in an array, such as a memory array 170 described with reference to FIG. 1. Although described with reference to a DRAM system, the techniques, systems, and devices as described herein may be applicable to any system that implements error correction encoding and decoding. A memory cell 205 may store a charge representative of the programmable states in a capacitor. DRAM architectures may include a capacitor that includes a dielectric material to store a charge representative of the programmable state. In other memory architectures, other storage devices and components are possible. For example, nonlinear dielectric materials may be employed. The memory cell 205 may include a logic storage component, such as capacitor 230, and a switching component 235. The capacitor 230 may be an example of a dielectric capacitor or a ferroelectric capacitor. A node of the capacitor 230 may be coupled with a voltage source 240, which may be the cell plate reference voltage, such as Vpl, or may be ground, such as Vss.

The memory die 200 may include one or more access lines (e.g., one or more word lines 210 and one or more digit lines 215) arranged in a pattern, such as a grid-like pattern. An access line may be a conductive line coupled with a memory cell 205 and may be used to perform access operations on the memory cell 205. In some examples, word lines 210 may be referred to as row lines. In some examples, digit lines 215 may be referred to as column lines or bit lines. References to access lines, row lines, column lines, word lines, digit lines, or bit lines, or their analogues, are interchangeable without loss of understanding or operation. Memory cells 205 may be positioned at intersections of the word lines 210 and the digit lines 215.

Operations such as reading and writing may be performed on the memory cells 205 by activating or selecting access lines such as one or more of a word line 210 or a digit line 215. By biasing a word line 210 and a digit line 215 (e.g., applying a voltage to the word line 210 or the digit line 215), a single memory cell 205 may be accessed at their intersection. The intersection of a word line 210 and a digit line 215 in either a two-dimensional or three-dimensional configuration may be referred to as an address of a memory cell 205.

Accessing the memory cells 205 may be controlled through a row decoder 220 or a column decoder 225. For example, a row decoder 220 may receive a row address from the local memory controller 260 and activate a word line 210 based on the received row address. A column decoder 225 may receive a column address from the local memory controller 260 and may activate a digit line 215 based on the received column address.

Selecting or deselecting the memory cell 205 may be accomplished by activating or deactivating the switching component 235 using a word line 210. The capacitor 230 may be coupled with the digit line 215 using the switching component 235. For example, the capacitor 230 may be isolated from digit line 215 when the switching component 235 is deactivated, and the capacitor 230 may be coupled with digit line 215 when the switching component 235 is activated.

The sense component 245 may be operable to detect a state (e.g., a charge) stored on the capacitor 230 of the memory cell 205 and determine a logic state of the memory cell 205 based on the stored state. The sense component 245 may include one or more sense amplifiers to amplify or otherwise convert a signal resulting from accessing the memory cell 205. The sense component 245 may compare a signal detected from the memory cell 205 to a reference 250 (e.g., a reference voltage). The detected logic state of the memory cell 205 may be provided as an output of the sense component 245 (e.g., to an input/output 255), and may indicate the detected logic state to another component of a memory device that includes the memory die 200.

The memory die 200 may include or be coupled with error correction coding circuitry 265, which may be configured to perform coding processes on data retrieved from an external device or from the memory cells 205. For example, as part of a read operation, the error correction coding circuitry 265 may receive data from the memory cells 205 and decode the data for subsequent use (e.g., for use at the local memory controller 260 or for transmission via the input/output 255). In another example, as part of a write operation, the error correction coding circuitry 265 may encode data received from the input/output 255 and may send the encoded data to the memory cells 205. In some examples, the error correction coding circuitry 265 may be configured to use a shared portion of circuitry that generates one or more syndromes based on received data or stored data (e.g., may generate the syndrome(s), respectively, for both encoding and decoding processes), using one or more coding matrices. In some examples, the error correction coding circuitry 265 may use the syndrome(s) in subsequent circuit-specific coding processes. For example, the syndrome(s) may be used by encoder-specific circuitry to generate a set of parity bits for encoding the data (e.g., for storage at the memory cells 205). The syndrome(s) may also be used by decoder-specific circuitry to generate an error vector for correcting errors in stored data (e.g., for subsequent transmission to an external device, such as via the input/output 255).

Although illustrated as a medium between input/output 255 and sense component 245, the error correction coding circuitry 265 may be located in any portion of a data stream. For example, the error correction coding circuitry 265 may be implemented by a memory system, a memory device, a controller, among other components (e.g., a memory device controller such as a managed NOT-AND (MNAND) die of a memory device).

The local memory controller 260 may control the accessing of memory cells 205 through the various components (e.g., row decoder 220, column decoder 225, sense component 245). The local memory controller 260 may be an example of the local memory controller 165 described with reference to FIG. 1. In some examples, one or more of the row decoder 220, column decoder 225, and sense component 245 may be co-located with the local memory controller 260. The local memory controller 260 may be operable to receive one or more of commands or data from one or more different memory controllers (e.g., an external memory controller 120 associated with a host device 105, another controller associated with the memory die 200), translate the commands or the data (or both) into information that can be used by the memory die 200, perform one or more operations on the memory die 200, and communicate data from the memory die 200 to a host device 105 based on performing the one or more operations. The local memory controller 260 may generate row signals and column address signals to activate the target word line 210 and the target digit line 215. The local memory controller 260 may also generate and control various voltages or currents used during the operation of the memory die 200. In general, the amplitude, the shape, or the duration of an applied voltage or current discussed herein may be varied and may be different for the various operations discussed in operating the memory die 200.

The local memory controller 260 may be operable to perform one or more access operations on one or more memory cells 205 of the memory die 200. Examples of access operations may include a write operation, a read operation, a refresh operation, a precharge operation, or an activate operation, among others. In some examples, access operations may be performed by or otherwise coordinated by the local memory controller 260 in response to various access commands (e.g., from a host device 105). The local memory controller 260 may be operable to perform other access operations not listed here or other operations related to the operating of the memory die 200 that are not directly related to accessing the memory cells 205.

The local memory controller 260 may be operable to perform a write operation (e.g., a programming operation) on one or more memory cells 205 of the memory die 200. During a write operation, a memory cell 205 of the memory die 200 may be programmed to store a desired logic state. The local memory controller 260 may identify a target memory cell 205 on which to perform the write operation. The local memory controller 260 may identify a target word line 210 and a target digit line 215 coupled with the target memory cell 205 (e.g., the address of the target memory cell 205). The local memory controller 260 may activate the target word line 210 and the target digit line 215 (e.g., applying a voltage to the word line 210 or digit line 215) to access the target memory cell 205. The local memory controller 260 may apply a specific signal (e.g., write pulse) to the digit line 215 during the write operation to store a specific state (e.g., charge) in the capacitor 230 of the memory cell 205. The pulse used as part of the write operation may include one or more voltage levels over a duration.

The local memory controller 260 may be operable to perform a read operation (e.g., a sense operation) on one or more memory cells 205 of the memory die 200. During a read operation, the logic state stored in a memory cell 205 of the memory die 200 may be determined. The local memory controller 260 may identify a target memory cell 205 on which to perform the read operation. The local memory controller 260 may identify a target word line 210 and a target digit line 215 coupled with the target memory cell 205 (e.g., the address of the target memory cell 205). The local memory controller 260 may activate the target word line 210 and the target digit line 215 (e.g., applying a voltage to the word line 210 or digit line 215) to access the target memory cell 205. The target memory cell 205 may transfer a signal to the sense component 245 in response to biasing the access lines. The sense component 245 may amplify the signal. The local memory controller 260 may activate the sense component 245 (e.g., latch the sense component) and thereby compare the signal received from the memory cell 205 to the reference 250. Based on that comparison, the sense component 245 may determine a logic state that is stored on the memory cell 205.

Figure 3:
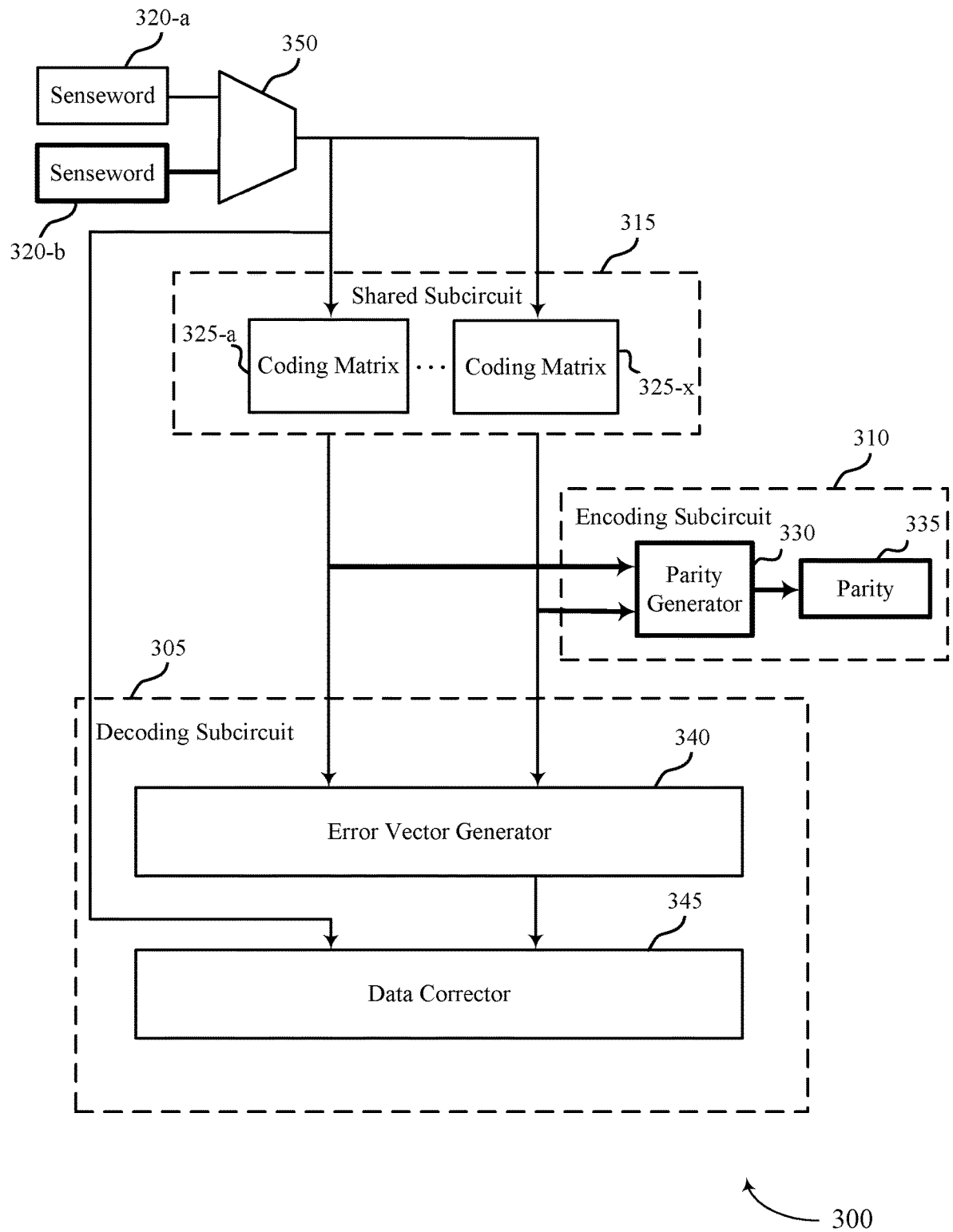
FIG. 3 illustrates an example of a circuit diagram that supports shared ECC circuitry in accordance with examples as disclosed herein.

FIG. 3 illustrates an example of a circuit diagram 300 that supports shared ECC circuitry in accordance with examples as disclosed herein. In some examples, circuit diagram 300 may be used by (or otherwise implemented in) systems such as system 100 or memory die 200 as described with reference to FIGS. 1 and 2, respectively. For example, the circuit diagram 300 may represent error correction coding circuitry 265 described with reference to FIG. 2, which may include circuitry that may be shared between encoder circuitry and decoder circuitry within a memory device.

For example, circuit diagram 300 may include a decoding subcircuit 305 configured to decode data input to the error correction coding circuitry, for example, when performing a read operation on data stored at one or more memory cells. In some examples, the decoding circuit 305 may receive the data, correct one or more errors therein, and output corrected data. Circuit diagram 300 may also include an encoding subcircuit 310 configured to encode data input to the error correction coding circuitry, for example, as part of a write operation for storing data at or more memory cells. As described herein, a portion of the circuitry in circuit diagram 300 may be referred to interchangeably as a circuit or a subcircuit without departing from the scope of the present disclosure. For example, decoding subcircuit 305 may be equivalently referred to as decoding circuit 305 without deviating from the scope of the techniques, systems, or devices described herein. Similar examples may also apply to the other subcircuits described herein.

In some examples, the encoding subcircuit 310 may include circuitry separate or different from the circuitry of the decoding subcircuit 305. For example, the encoding subcircuit 310 may be configured to encode data for storage at one or more memory cells (e.g., a data path associated with storing data) and the decoding subcircuit 305 may be configured to decode data that has been accessed from one or more memory cells (e.g., a data path associated with reading data), where the transmission data path and the reception data path use circuitry (or portions of a device)

separate from one another. In some cases, the separate or different circuitry of the encoding subcircuit 310 and the decoding subcircuit 305 may result in a relatively large area occupied by the error correction coding circuitry, which may increase manufacturing complexity, manufacturing costs, and may increase a device size.

In some examples, circuit diagram 300 may support the use of a shared subcircuit 315 that may be shared between the encoding subcircuit 310 and the decoding subcircuit 305. For example, the decoding subcircuit 305 and the shared subcircuit 315 may both be a part of a BCH2 decoder circuitry, where the shared subcircuit 315 may be configured to reuse some BCH2 decoder circuitry for a BCH2 encoding process. In some examples, the shared subcircuit 315 may be configured to receive an input (e.g., data and associated parity bits, a codeword, a senseword) from a multiplexer 350 which may be configured to receive the input from one or more components of a memory device, such as from an input/output component associated with a local memory controller, from the memory cells, or any other component of the memory device. The multiplexer 350 may further be configured to output a corresponding senseword 320 (e.g., as received at the multiplexer 350) to the shared subcircuit 315 in accordance with a circuit-specific process (e.g., an encoding process, a decoding process).

The shared subcircuit 315 may, for example, perform one or more operations that may produce outputs associated with (e.g., used by) both the encoding subcircuit 310 and the decoding subcircuit 305. For example, the shared subcircuit 315 may be configured to receive a senseword 320 (e.g., data and associated parity bits) and perform one or more operations on the senseword 320 to generate one or more syndromes (e.g., vectors) to be used in subsequent encoding or decoding processes (e.g., processes related to single error correction (SEC), double error correction (DEC)).

In some examples, the shared subcircuit 315 may perform one or more operations on the senseword 320 with circuitry that is based on one or more coding matrices 325. For example, the shared subcircuit 315 may include exclusive-or (XOR) circuitry configured to receive an input of a senseword 320 and perform one or more operations to effectively multiply the senseword 320 with one or more coding matrices 325. As an illustrative example, the shared subcircuit 315 may effectively multiply the senseword 320 with a coding matrix 325-a based on Equation (1):

$$S_1 = y(\alpha) = [y_0, \ldots, y_{n-1}] \begin{bmatrix} 1 \\ \alpha \\ \alpha^2 \\ \ldots \\ \alpha^{n-1} \end{bmatrix} = yA_1^T, \quad (1)$$

where $S_1$ may represent a first syndrome output by the shared subcircuit 315, y may represent the senseword 320 as a vector of length n (e.g., y may represent a vector having data and parity bits $[y_0, \ldots, y_{n-1}]$). In some examples, $\alpha$ may be an element of a field (e.g., GF(2m)), where a may be a binary vector of length m. In an example, $\alpha$ may be a primitive element of the field where, in some cases, $\alpha$ may be represented by the vector $\alpha=(0\ 1\ 0\ 0\ \ldots\ 0)$. The first entry in $\alpha$ may be a least significant bit (LSB) and the last entry in the vector may be a most significant bit (MSB). $A_1^T$ may represent the coding matrix 325-a and may have dimensions of n×m (e.g., having n rows and m columns). The rows of $A_1^T$ may each include a respective row vector (e.g., 1, $\alpha, \alpha^2, \ldots, \alpha^{n-1}$) of length m that may be associated with transforming y into a syndrome $S_1$ used by the decoding subcircuit 305 or the encoding subcircuit 310. As such, the operation $y(\alpha)$ may represent the evaluation of a polynomial $y(x)$, where $x=\alpha$. In Equation 1, the evaluation of $y(\alpha)$ may be represented by the multiplication of y with the matrix $A_1^T$. The parameter m may depend on a configuration of the circuits and subcircuits of the circuit diagram 300 (e.g., how components are connected to perform calculations), which may in turn be based on a type of cyclic error coding scheme (e.g., BCH, CRC), among other factors associated with the coding calculations. The dimension n may be equal to k+2m, where k represents a quantity of data bits and 2m represents a quantity of parity bits, and where $n<2^m$.

The senseword 320, y, may include a data vector of length k and a sequence of parity bits of length 2m, where a first portion of the elements of y (e.g., $y_0, \ldots y_{2m-1}$) may correspond to the parity bits and a second portion (e.g., of length k) of the elements of y (e.g., $y_{2m}, \ldots, y_{n-1}$) may correspond to the data vector. The data vector may represent either data to be encoded (e.g., data received from an external device, such as a host device) or data to be decoded (e.g., data read from memory cells of the memory device). A content of the parity bits may depend on the coding process. For example, a senseword 320-a may be input to the shared subcircuit 315 as part of a decoding process, and the parity bits may include bits used to identify a sequence of logic states of the data vector, and which the decoding subcircuit 305 may use as part of a decoding process. In another example, a senseword 320-b may be input to the shared subcircuit as part of an encoding process, and the parity bits may include a sequence of zeros (e.g., in order for the dimension of y to comply with the matrix multiplication associated with shared subcircuit 315).

In some examples, the shared subcircuit 315 may perform one or more operations on the senseword 320 using more than one effective coding matrix 325. For example, the shared subcircuit 315 may effectively multiply a senseword 320 with more than one coding matrix 325, thereby producing more than one syndrome. In some cases, the quantity of coding matrices 325 associated with the shared subcircuit 315 may be based on the coding scheme of the circuit diagram 300. For example, if the coding scheme of the circuit diagram 300 is a BCH2 coding scheme, the shared subcircuit 315 may be based on two coding matrices 325, namely coding matrix 325-a and coding matrix 325-x. In another example, if the coding scheme of the circuit diagram 300 is a BCH3 coding scheme, the shared subcircuit 315 may be based on three coding matrices 325, for example, coding matrix 325-a, a second coding matrix 325, and coding matrix 325-x (e.g., a third coding matrix). As an illustrative example, the shared subcircuit 315 may effectively multiply the senseword 320 with coding matrix 325-a according to Equation (1) and may effectively multiply the senseword 320 with coding matrix 325-x according to Equation (2):

$$S_3 = y(\alpha^3) = [y_0, \ldots, y_{n-1}] \begin{bmatrix} 1 \\ \alpha^3 \\ \alpha^6 \\ \ldots \\ \alpha^{(n-1)\cdot 3} \end{bmatrix} = yA_3^T, \quad (2)$$

where $S_3$ may represent a second syndrome output by the shared subcircuit 315, y may represent the senseword 320 as a vector of length n (e.g., y may represent a vector having data and parity bits [$y_0, \ldots y_{n-1}$]). In some examples, $\alpha^3$ may be an element of a field (e.g., finite field GF($2^m$)), where $\alpha^3$ may be a binary vector of length m.

$A_3^T$ may represent the coding matrix 325-x and may have dimensions of n×m (e.g., having n rows and m columns). In some examples, the rows of $A_3^T$ may be the first n powers of $\alpha^3$. The rows of $A_3^T$ may each include a respective row vector (e.g., 1, $\alpha^3$, $\alpha^6$, ..., $\alpha^{(n-1)\cdot 3}$) of length m that may be associated with transforming y into a syndrome $S_3$ used by the decoding subcircuit 305 or the encoding subcircuit 310. As such, the operation $y(\alpha^3)$ may represent the evaluation of a polynomial y(x), where $x=\alpha^3$. In Equation 2, the evaluation of $y(\alpha^3)$ may be represented by the multiplication of y with the matrix $A_3^T$. The parameter m may depend on a configuration of the circuits and subcircuits of the circuit diagram 300 (e.g., how components are interlaced and connected to perform calculations), which may in turn be based on a type of cyclic error coding scheme (e.g., BCH, BCH2, BCH3, CRC), among other factors associated with the coding calculations. Further, m may be based on a logarithmic relationship with a number of data bits k. That is, m may increase logarithmically for increasing k. m may also be used to determine a maximum codeword length N, which is equal to $2^m-1$, where the length of a codeword n may be less than or equal to N. m may also be used to determine the length of a codeword n, itself. For example, n may be equal to k+mt, where t may be a corrective power of the error correction code (e.g., t=1 for BCH, t=2 for BCH2, t=3 for BCH3, and so on).

In some examples, the shared subcircuit 315 may effectively multiply the senseword 320 with the different coding matrices 325 separately. For example, the shared subcircuit 315 may include a first portion configured to effectively multiply senseword 320 with coding matrix 325-a and a second portion configured to effectively multiply the senseword 320 with coding matrix 325-x, where the first portion and the second portion may be independent portions of the shared subcircuit 315. As such, the shared subcircuit 315 may produce the syndromes independently (e.g., separately).

In other examples, the shared subcircuit 315 may perform one or more operations to effectively multiply the senseword 320 with the coding matrices 325 in tandem (e.g., at the same time, step, circuit components). For example, the shared subcircuit 315 may include circuitry configured to effectively multiply senseword 320 with a combination of the coding matrix 325-a and the coding matrix 325-x, producing a combined syndrome. As an illustrative example, the shared subcircuit 315 may effectively multiply the senseword 320 with a combination of the coding matrices 325 according to Equation (3). In some cases, as described herein, the effective multiplication may take place separately, and may generate two different syndromes, which if combined or juxtaposed would satisfy Equation (3):

$$\sum = [S_1, S_3] = [y_0, \ldots, y_{n-1}] \begin{bmatrix} 1 & 1 \\ \alpha & \alpha^3 \\ \alpha^2 & \alpha^6 \\ \ldots & \ldots \\ \alpha^{n-1} & \alpha^{(n-1)\cdot 3} \end{bmatrix} = y[A_1^T, A_3^T] = yA^T, \quad (3)$$

where $S_1$ may represent a first syndrome output by the shared subcircuit 315, $S_3$ may represent a second syndrome output by the shared subcircuit 315, $\Sigma$ may represent a juxtaposition or combination of $S_1$ and $S_3$, y may represent the senseword 320 as a vector of length n (e.g., y may represent a vector having data and parity bits [$y_0, \ldots, y_{n-1}$]), $A_1^T$ may represent a transposed matrix (e.g., the coding matrix 325-a) including base elements [1, $\alpha$, $\alpha^2$, ..., $\alpha^{n-1}$] and having dimensions of n×m, $A_3^T$ may represent a transposed matrix (e.g., the coding matrix 325-b) including base elements [1, $\alpha^3$, $\alpha^6$, ..., $\alpha^{(n-1)\cdot 3}$] and having dimensions of n×m, and $A^T$ may represent a juxtaposition or combination of $A_1^T$ and $A_3^T$.

The rows of $A_1^T$ may each include a respective row vector (e.g., 1, $\alpha$, $\alpha^2$, ..., $\alpha^{n-1}$) of length m that may be associated with transforming y into a syndrome $S_1$ to be used by the decoding subcircuit 305 or the encoding subcircuit 310. The rows of $A_3^T$ may each include a respective row vector (e.g., 1, $\alpha^3$, $\alpha^6$, ..., $\alpha^{(n-1)\cdot 3}$) of length m that may be associated with transforming y into a syndrome $S_3$ to be used by the decoding subcircuit 305 or the encoding subcircuit 310. The parameter m may depend on a configuration of the circuits and subcircuits of the circuit diagram 300 (e.g., how components are interlaced and connected to perform calculations), which may in turn be based on a type of cyclic error coding scheme (e.g., BCH, BCH2, BCH3, CRC), among other factors associated with the coding calculations.

In some examples, $A^T$ may represent the combination of coding matrix 325-a and coding matrix 325-x and may have dimensions n×2m. In some examples, a dimension of the $A^T$ may depend on the coding scheme. For example, in BCH2, the shared subcircuit 315 may use two coding matrices 325, thereby making the dimensions of the $A^T$ matrix n×2m. In another example, in BCH3, the shared subcircuit 315 may use three coding matrices 325, thereby making the dimensions of the $A^T$ matrix n×3m. The rows of $A^T$ may include the row vectors of the combined matrices $A^T$ and $A_3^T$, where a first column may include the row vectors associated with $A_1^T$ and a second column may include the row vectors associated with $A_3^T$. The multiplication of y and $A^T$ may produce $\Sigma$, a single syndrome including the components of $S_1$ and $S_3$, where the length of $\Sigma$ may be 2m.

In some examples, the syndrome(s) produced by the shared subcircuit 315 may be used as part of an encoding process, where the encoding subcircuit 310 may receive the syndrome(s) and may produce parity bits 335 for the data, using a parity generator 330. In some examples, as part of the encoding process, the memory device may deactivate the decoding subcircuit 305, for example, by clock gating an input of the decoding subcircuit 305, gating the inputs of the decoding subcircuit 305, or preventing bit flipping. As such, after the shared subcircuit 315 generates the syndrome(s), the encoding subcircuit 310 may be configured to receive the syndrome(s) and perform one or more operations on the syndrome(s). In some examples, the encoding subcircuit 310 may perform one or more operations on the syndrome(s) with circuitry that effectively multiplies the syndrome(s) with a parity matrix. For example, the encoding subcircuit 310 may include XOR circuitry configured to receive an input of the one or more syndrome(s) and effectively multiply the syndrome(s) with the parity matrix. As an illustrative example, the encoding subcircuit 310 may effectively multiply a syndrome with a parity matrix according to Equation (4):

$$S = yH^T = [S_1, S_3]F = y\begin{bmatrix} I \\ P \end{bmatrix} = [0, d]\begin{bmatrix} I \\ P \end{bmatrix} = dP = p \quad (4)$$

where S may be a parity syndrome generated for an encoding process (e.g., with a length of 2m), $S_1$ may represent a first syndrome output by the shared subcircuit 315, $S_3$ may represent a second syndrome output by the shared subcircuit 315, y may represent the senseword 320 as a vector of length n (e.g., y may represent a vector having data and parity bits $[y_0, \ldots, y_{n-1}]$), F may be a parity matrix that includes elements associated with transforming syndromes into parity bits, I may be the identity matrix (e.g., including values of "1" in each diagonal entry of the identity matrix and values of "0" elsewhere) and having a dimension of 2m×2m, P may be a matrix (e.g., having dimensions of k×2m) associated with producing a parity vector within the parity syndrome S, d may be a data vector (e.g., within the vector y), p may represent the newly generated parity bits (e.g., having a length of 2m) generated by multiplying the first syndrome and the second syndrome with the parity check matrix (e.g., using the encoding subcircuit 310), and $H^T$ may be a transposed matrix and may be referred to as a parity check matrix (e.g., with dimensions of n×2m).

In some examples, the effective multiplication of y and $H^T$ may produce the parity syndrome, S, which may be associated with a subsequent encoding process. Specifically, $H^T$ may include matrix I (e.g., identity) and matrix P. In some examples, S may be produced by effectively multiplying Σ (e.g., a syndrome representing the combination of the first syndrome and the second syndrome generated by shared subcircuit 315) by a parity matrix F. The parity matrix F may be determined based on the matrix $A^T$ (e.g., the matrix representing the combination of the coding matrices 325).

For example, $A^T$ may be equivalently represented by $$\begin{bmatrix} I \\ P \end{bmatrix} E, \text{where } \begin{bmatrix} I \\ P \end{bmatrix}$$

may be the parity check matrix $H^T$, and E may be a square matrix (e.g., with dimensions 2m×2m) including at least a portion of the matrix $A^T$. The inverse of E may be the matrix F, where the multiplication EF may produce the identity matrix I. As such, effectively multiplying Σ and F may produce the same result as effectively multiplying y and $H^T$. That is, effectively multiplying the syndrome Σ (e.g., the combined syndrome), produced by the shared subcircuit 315, with the parity matrix F may produce the parity syndrome S, which may be associated with a subsequent encoding process (e.g., may be equivalent to or include parity bits 335, or p, associated with the received data). In some examples, the parity bits 335 may be extracted from the parity syndrome S and used to encode data input to the shared subcircuit 315. For example, the memory device may extract the parity bits 335 (e.g., p) from the parity syndrome S and may store the parity bits 335, along with the data associated with the parity bits 335, within one or more memory cells of the memory device. Storing the parity bits 335 along with the associated data may be associated with encoding the data or may be referred to as encoding the data (e.g., generating the parity bits 335 may be a part of encoding the data).

In some examples, the syndrome(s) produced by the shared subcircuit 315 may be used as part of a decoding process, where the decoding subcircuit 305 may receive the syndrome(s) and may generate corrected data therefrom using error vector generator 340 and data corrector 345. In some examples, as part of the decoding process, the memory device may deactivate the encoding subcircuit 310, for example, by clock gating an input of the encoding subcircuit 310, gating the inputs of the decoding subcircuit 310, or preventing bit flipping. As such, after the shared subcircuit 315 generates the syndrome(s), the decoding subcircuit 305 may receive the syndrome(s) and perform one or more operations on the syndrome(s). For example, the decoding subcircuit 305 may generate an error vector using an error vector generator 310.

An error vector may be (or may be included in) a binary vector (e.g., of length n), indicating one or more errors in the stored data. In some cases, each element in the error vector may indicate an error in a corresponding position of a data vector, and as such, may be used to flip one or more bits in the data vector, correcting the data. The error vector may be generated by error vector generator 310 using the syndrome(s) (e.g., syndrome(s) generated by shared subcircuit 315). The decoding subcircuit 305 may generate error vectors according to the coding scheme configured for the decoding subcircuit 305. For example, based on the coding scheme supported by the memory device, the error vector(s) may indicate up to an associated quantity of errors (e.g., up to two errors for BCH2, up to three errors for BCH3).

The decoding sub circuit 305 may be configured to use a BCH2 coding scheme and as such, the decoding subcircuit 305 may generate an error vector that supports correction of up to two errors in the stored data. The decoding subcircuit 305 may generate error vectors according to any type of coding scheme, for example, any cyclic error code (e.g., BCH, BCH2, BCH3). As such, the decoding subcircuit 305 may generate error vectors that support correction of a quantity of errors corresponding to the type of coding scheme. For example, the generated error vector may support correction of up to one error when using a BCH coding scheme or may include up to three errors when using a BCH3 coding scheme.

The decoding subcircuit 305 may include a data corrector 345 with which the decoding subcircuit 305 may use to identify errors associated with (e.g., identified using) error vectors, correct the errors, and output corrected data based on the identified errors and the data input to the error correction coding circuitry. For example, the data corrector may be configured to input an error vector from error vector generator 340 and a senseword 320 from multiplexer 350. Data corrector 345 may combine (e.g., add using XOR circuitry) the senseword 320 with the error vector generated by the error vector generator 340. In some examples, the error correction coding circuitry may transmit the corrected data to another device, such as a host device, for example, via an input/output device, or any other intermediate circuit component electronically coupled between the other device and the memory device. Configuring a device to include circuitry shared between an encoding subcircuit 310 and a decoding subcircuit 305 may support the use of a smaller device area for error correction coding circuitry, thereby reducing manufacturing costs, manufacturing complexity, and decreasing a device size.

Figure 4:
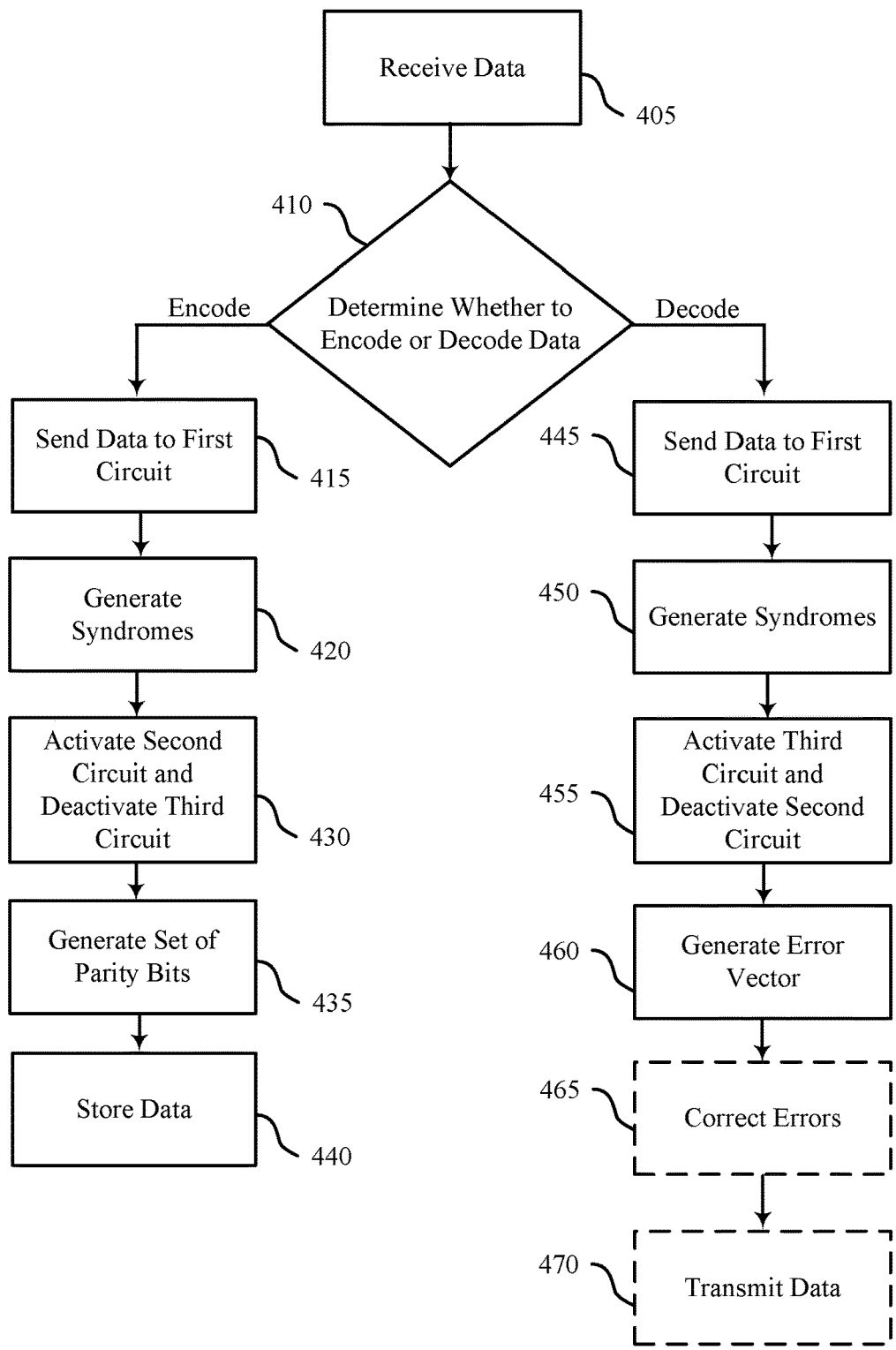
FIG. 4 illustrates an example of a flow diagram that supports shared ECC circuitry in accordance with examples as disclosed herein.

FIG. 4 illustrates an example of a flow diagram 400 that supports shared ECC circuitry in accordance with examples as disclosed herein. The operations of flow diagram 400 may be implemented by a system as described with reference to FIGS. 1 through 3. For example, a memory device associated with (or including) circuitry configured according to circuit diagram 300 may perform operations associated with the flow diagram 400 to support shared circuitry between an encoder and a decoder. Alternative examples of the following may be implemented, where some steps are performed in a different order or not at all. Additionally, some steps may include additional features not mentioned below.

Aspects of the flow diagram 400 may be implemented by a memory system, a memory device, a controller, or any combination thereof, among other components (e.g., a memory device controller such as a NAND die of a memory device). Additionally or alternatively, aspects of the flow diagram 400 may be implemented as instructions stored in memory (e.g., firmware stored in a memory coupled with the memory device). For example, the instructions, if executed by a controller, may cause the controller to perform one or more operations of the flow diagram 400. In another example, the one or more operations of the flow diagram 400 may be performed by an encoding circuit, a decoding circuit, shared circuitry between the encoding circuit and the decoding circuit, or any combination thereof.

At 405, data may be received at the memory device. For example, a memory device may include a means for receiving data (e.g., a data channel, a pin). As such, the memory device may receive data from a host device, or other external device, for storage at the memory device. In some examples, the external device may be a host system where the host system may transmit the data to the memory device according to a memory access operation (e.g., a write operation). In some examples, the transmitting device may be a device external to the memory device, where the data received at the memory device may be received via a channel coupled with the device external to the memory device.

At 410, the memory device may determine whether to encode or decode the data. For example, if the data received at 405 is to be encoded (e.g., based on the data being associated with a write command, based on receiving the data from an external device), the memory device may determine to perform an encoding process.

In some cases, the data received at 405 may be encoded at the memory device. As such, at 415, the data may be sent via a channel to a first circuit. In some examples, the data may be sent via a multiplexer coupled with the channel, where the multiplexer may be coupled with an array of memory cells of the memory device. In some examples, the first circuit may be a circuit shared between an encoding subcircuit and a decoding subcircuit, such as shared subcircuit 315 as described with reference to FIG. 3.

At 420, the first circuit may generate one or more syndromes based on the received data, where the one or more syndromes may be associated with a cyclic error correction code operable to correct at least two errors. In some examples, the first circuit may generate each of the one or more syndromes using a circuit (e.g., XOR circuitry) for performing effective matrix multiplication with the received data. For example, the first circuit may include XOR circuitry that may be based on a first matrix, having a size of a first (e.g., n) dimension by a second dimension (e.g., 2m in BCH2). In some examples, the first dimension may be equal to a quantity of bits associated with the data received at 405 (e.g., k+2m in BCH2). In some examples, the second dimension may be equal to a quantity of parity bits, for example, a quantity of parity bits generated in subsequent encoding procedures. Matrices and vectors associated with encoding processes are described in more detail with reference to FIG. 3.

At 430, based on determining to perform the encoding process on the data received at 405, the memory device may activate a second circuit, such as encoding subcircuit 310 as described with reference to FIG. 3. Further, the memory device may deactivate a third circuit (e.g., by clock gating an input of the third circuit, gating the inputs of the third circuit, preventing bit flipping), such as decoding circuit 305 as described with reference to FIG. 3. Based on activating the first circuit (e.g., the encoding subcircuit) and deactivating the third circuit (e.g., the decoding subcircuit), the second circuit may receive the one or more syndromes from the first circuit and may perform an encoding process therewith.

At 435, the second circuit may generate a set of parity bits based on the one or more syndromes. In some examples, the second circuit may receive the syndrome(s) from the first circuit and may generate the set of parity bits using circuitry (e.g., XOR circuitry) for effectively performing matrix multiplication with the one or more syndromes. For example, the second circuit may include XOR circuitry configured to use a second matrix (e.g., a parity matrix), having a size of the second dimension by the second dimension. The second circuit may effectively multiply the syndrome(s) by a parity matrix associated with the parity generator 330 as described with reference to FIG. 3. The memory device may perform a subsequent encoding process with the generated parity bits.

At 440, the data may be stored. For example, the memory device may generate the parity bits and may store the parity bits, along with the data associated with the parity bits, within one or more memory cells of the memory device. Storing the parity bits along with the associated data may be associated with, or may represent, encoding the data.

In another example, the data received at 405 may be associated with a decoding process. For example, the data may be stored at a set of memory cells of the memory device. The data may be stored along with a set of parity bits generated at 435, where storing the data and the parity bits may be based on generating the parity bits (e.g., based on a previous encoding process).

At 410, the memory device may determine whether to encode or decode the data. For example, if the data received at 405 is to be decoded (e.g., based on receiving a read command, based on accessing the data), the memory device may determine to perform a decoding process. For example, a decoding circuit may be configured to identify errors associated with (e.g., identified using) error vectors, correct the errors, and output corrected data based on the identified errors and the data input to the error correction coding circuitry.

In some cases, the memory device may receive data. For example, the memory device may receive a command (e.g., a read command), based on which the memory device may access a set memory cells associated with the data and may retrieve the data (e.g., read the data) from the set of memory cells. In some examples, the memory device may access the set of parity bits associated with the data, for example, based on storing the set of parity bits at the set of memory cells and based on receiving the command.

At 445, the memory device may send the data to the first circuit. For example, the accessed data (as per the previous example) may be sent via a channel to the first circuit. In some examples, the data may be sent to the first circuit via the multiplexer coupled with the channel.

At 450, the first circuit may generate one or more syndromes based on the received data, where the one or more syndromes may be associated with a cyclic error correction code operable to correct one or more errors (e.g., at least two errors). In some examples, the first circuit may generate each of the one or more syndromes based on a first matrix and a second matrix (e.g., respective coding matrices). The matrices and vectors associated with syndrome generation processes are described in more detail with reference to FIG. 3.

At 455, based on determining to perform the decoding process on the data received at 405, the memory device may activate the third circuit, such as decoding subcircuit 305 as described with reference to FIG. 3. Further, the memory device may deactivate the second circuit (e.g., by clock gating an input of the second circuit gating the inputs of the second circuit, preventing bit flipping), such as encoding circuit 310 as described with reference to FIG. 3. Based on activating the third circuit (e.g., the decoding subcircuit) and deactivating the second circuit (e.g., the encoding subcircuit), the third circuit may receive the one or more syndromes from the first subcircuit and may perform a decoding process therewith.

At 460, the third circuit may generate an error vector for decoding the stored data based on the one or more syndromes generated at the first circuit. For example, the third circuit may generate an error vector using the syndrome(s) (e.g., or variations thereof). Each entry in the generated error vector may be associated with a corresponding entry in a data vector, where if an entry in the error vector indicates an error, the corresponding entry in the data vector may include an error. In some examples, the error vector may be based on the coding scheme at the memory device. For example, the coding scheme may be a BCH2 coding scheme, where the memory device may generate the error vector that supports correction of at most two errors.

At 465, in some examples (e.g., if errors are found in the data), the third circuit may correct one or more errors in the stored data based on the generated error vector. For example, the third circuit may use the generated error vector to identify and correct one or two bits of errors within the stored data (e.g., among other amounts of corrected bits). In some examples, at 470, the error correction coding circuitry may transmit the data (e.g., corrected data) to another device, such as a host device, for example, via an input/output device, or any other intermediate circuit component electronically coupled between the other device and the memory device.

The techniques described herein may support systems and devices sharing circuitry between encoding and decoding circuits, which may reduce manufacturing complexity, costs, and reduce a device size.

Figure 5:
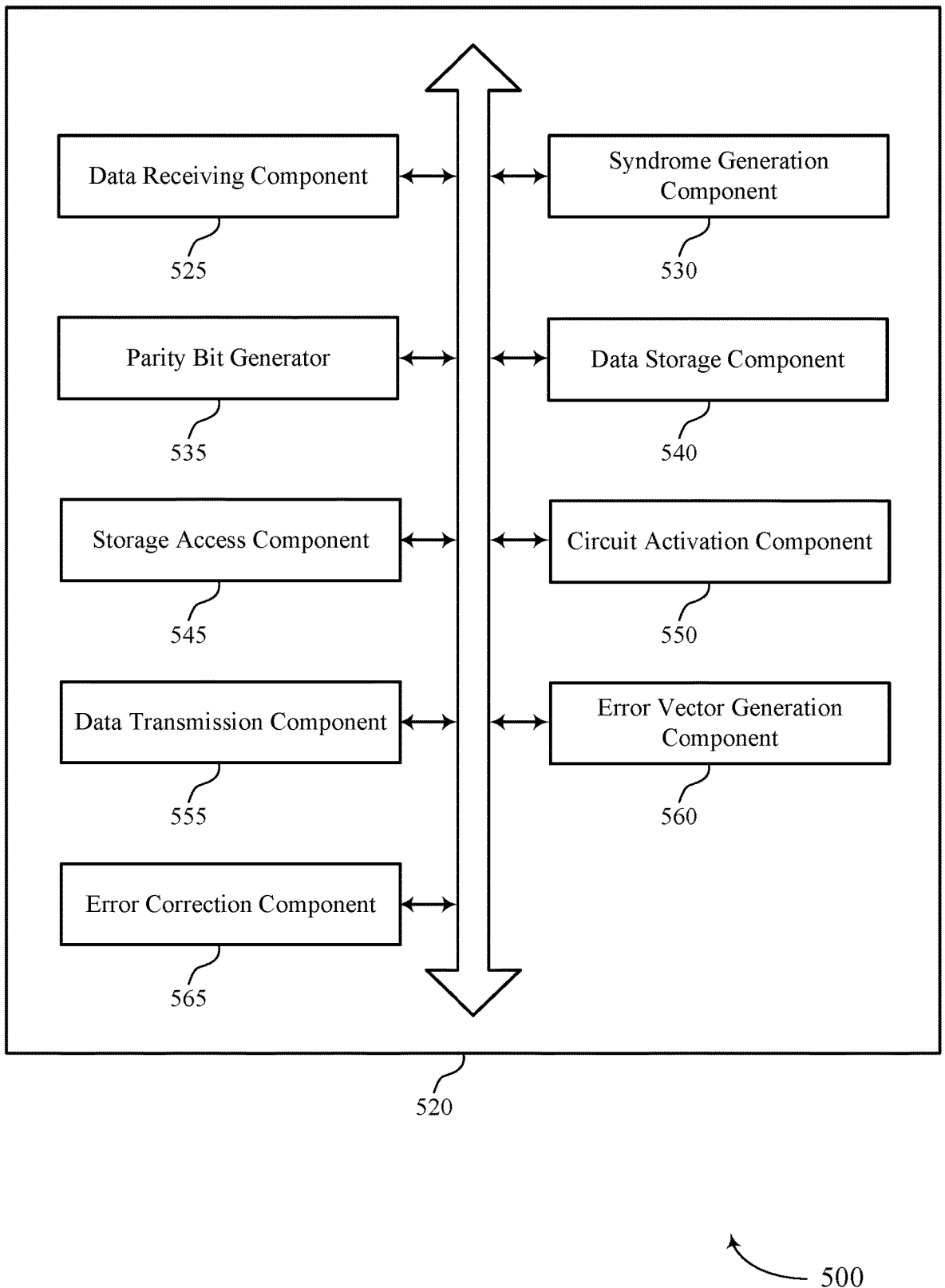
FIG. 5 shows a block diagram of a memory device that supports shared ECC circuitry in accordance with examples as disclosed herein.

FIG. 5 shows a block diagram 500 of a memory device 520 that supports shared ECC circuitry in accordance with examples as disclosed herein. The memory device 520 may be an example of aspects of a memory device as described with reference to FIGS. 1 through 4. The memory device 520, or various components thereof, may be an example of means for performing various aspects of shared ECC circuitry as described herein. For example, the memory device 520 may include a data receiving component 525, a syndrome generation component 530, a parity bit generator 535, a data storage component 540, a storage access component 545, a circuit activation component 550, a data transmission component 555, an error vector generation component 560, an error correction component 565, or any combination thereof. Each of these components may communicate, directly or indirectly, with one another (e.g., via one or more buses).

The data receiving component 525 may be configured as or otherwise support a means for receiving data at a memory device. The syndrome generation component 530 may be configured as or otherwise support a means for generating, at a first circuit of the memory device and based on the data, a set of multiple syndromes associated with a cyclic error correction code operable to correct at least two errors. The parity bit generator 535 may be configured as or otherwise support a means for generating, at a second circuit of the memory device and based on the set of multiple syndromes, a set of parity bits associated with the data.

In some examples, the data storage component 540 may be configured as or otherwise support a means for storing the data and the set of parity bits at a set of memory cells of the memory device based on generating the set of parity bits. In some examples, the storage access component 545 may be configured as or otherwise support a means for accessing the stored data and the set of parity bits based on a command received by the memory device. In some examples, the syndrome generation component 530 may be configured as or otherwise support a means for generating, at the first circuit of the memory device and based on the stored data, a second set of multiple syndromes associated with a cyclic error correction code operable to correct at least two errors.

In some examples, the error vector generation component 560 may be configured as or otherwise support a means for generating, at a third circuit of the memory device and based at least on the second set of multiple syndromes and the set of parity bits, an error vector for decoding the stored data.

In some examples, the error correction component 565 may be configured as or otherwise support a means for correcting one or more errors in the stored data based at least part on the generated error vector.

In some examples, the circuit activation component 550 may be configured as or otherwise support a means for activating the third circuit and deactivating the second circuit based on performing a decoding process on the stored data, where generating the error vector is based on activating the third circuit and deactivating the second circuit.

In some examples, the circuit activation component 550 may be configured as or otherwise support a means for activating the second circuit and deactivating a third circuit of the memory device based on performing an encoding process on the data, where generating the set of parity bits is based on activating the second circuit and deactivating the third circuit.

In some examples, the data receiving component 525 may be configured as or otherwise support a means for receiving the data at the memory device via a channel coupled with a device external to the memory device. In some examples, the data transmission component 555 may be configured as or otherwise support a means for sending the data to the first circuit via a multiplexer coupled with the channel and the first circuit, where the multiplexer is coupled with an array of memory cells of the memory device.

In some examples, the syndrome generation component 530 may be configured as or otherwise support a means for generating each of the set of multiple syndromes using a respective first matrix having a size of a first dimension by a second dimension, where the first dimension is equal to a quantity of bits of the data plus a quantity of parity bits of the set of parity bits and the second dimension is equal to the quantity of parity bits. In some examples, the parity bit generator 535 may be configured as or otherwise support a means for generating the set of parity bits using a second matrix having a size of the second dimension by the second dimension.

The data receiving component 525 may be configured as or otherwise support a means for receiving data at a memory device. In some examples, the syndrome generation component 530 may be configured as or otherwise support a means for generating, based on the data, a set of multiple syndromes associated with a cyclic error correction code operable to correct at least two errors. In some examples, the parity bit generator 535 may be configured as or otherwise support a means for generating, based on the set of multiple syndromes, a set of parity bits associated with the data.

Figure 6:
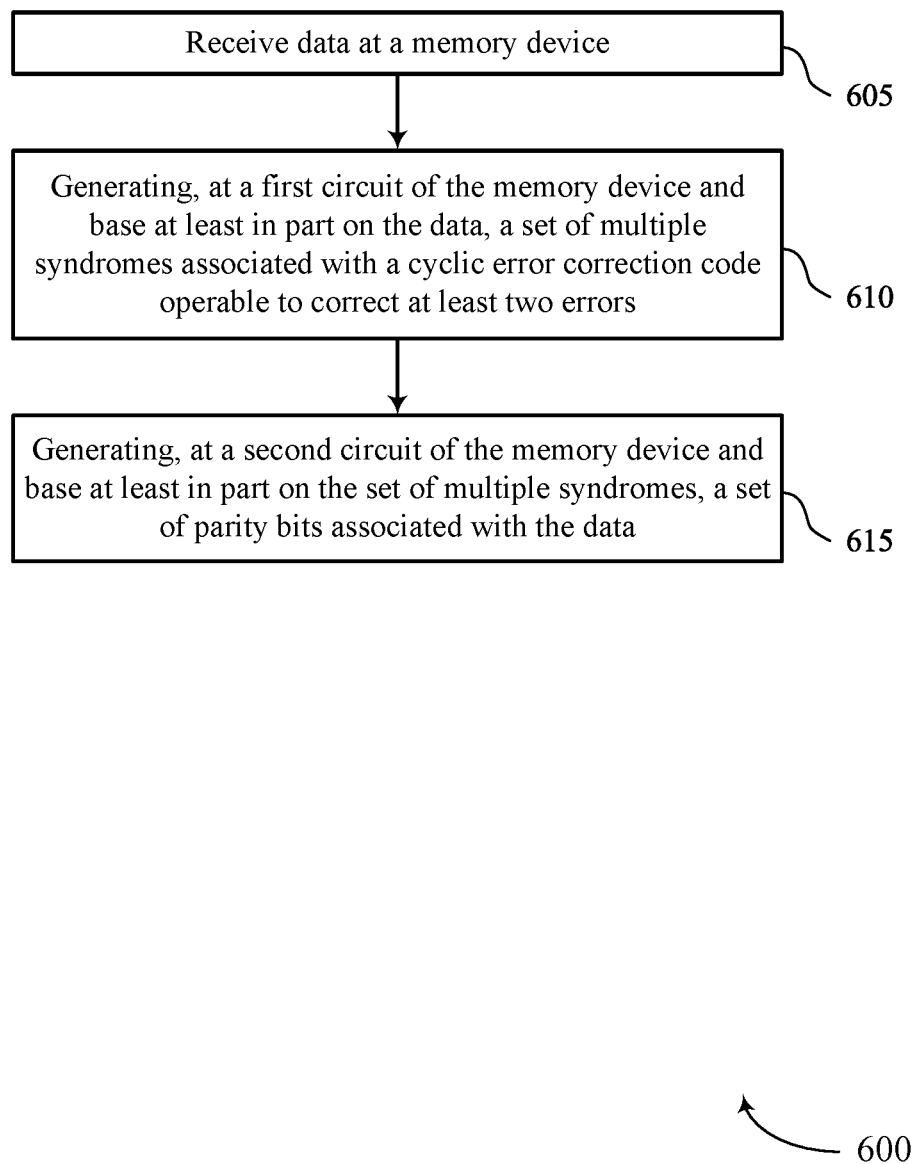
FIG. 6 shows a flowchart illustrating a method or methods that support shared ECC circuitry in accordance with examples as disclosed herein.

FIG. 6 shows a flowchart illustrating a method 600 that supports shared ECC circuitry in accordance with examples as disclosed herein. The operations of method 600 may be implemented by a memory device or its components as described herein. For example, the operations of method 600 may be performed by a memory device as described with reference to FIGS. 1 through 5. In some examples, a memory device may execute a set of instructions to control the functional elements of the device to perform the described functions. Additionally or alternatively, the memory device may perform aspects of the described functions using special-purpose hardware.

At 605, the method may include receiving data at a memory device. The operations of 605 may be performed in accordance with examples as disclosed herein. In some examples, aspects of the operations of 605 may be performed by a data receiving component 525 as described with reference to FIG. 5.

At 610, the method may include generating, at a first circuit of the memory device and based on the data, a set of multiple syndromes associated with a cyclic error correction code operable to correct at least two errors. The operations of 610 may be performed in accordance with examples as disclosed herein. In some examples, aspects of the operations of 610 may be performed by a syndrome generation component 530 as described with reference to FIG. 5.

At 615, the method may include generating, at a second circuit of the memory device and based on the set of multiple syndromes, a set of parity bits associated with the data. The operations of 615 may be performed in accordance with examples as disclosed herein. In some examples, aspects of the operations of 615 may be performed by a parity bit generator 535 as described with reference to FIG. 5.

In some examples, an apparatus as described herein may perform a method or methods, such as the method 600. The apparatus may include, features, circuitry, logic, means, or instructions (e.g., a non-transitory computer-readable medium storing instructions executable by a processor) for receiving data at a memory device, generating, at a first circuit of the memory device and based on the data, a set of multiple syndromes associated with a cyclic error correction code operable to correct at least two errors, and generating, at a second circuit of the memory device and based on the set of multiple syndromes, a set of parity bits associated with the data.

Some examples of the method 600 and the apparatus described herein may further include operations, features, circuitry, logic, means, or instructions for storing the data and the set of parity bits at a set of memory cells of the memory device based on generating the set of parity bits, accessing the stored data and the set of parity bits based on a command received by the memory device, and generating, at the first circuit of the memory device and based on the stored data, a second set of multiple syndromes associated with a cyclic error correction code operable to correct at least two errors.

In some examples of the method 600 and the apparatus described herein, generating, at a third circuit of the memory device and based at least on the second set of multiple syndromes and the set of parity bits, an error vector for decoding the stored data.

Some examples of the method 600 and the apparatus described herein may further include operations, features, circuitry, logic, means, or instructions for correcting one or more errors in the stored data based at least part on the generated error vector.

Some examples of the method 600 and the apparatus described herein may further include operations, features, circuitry, logic, means, or instructions for activating the third circuit and deactivating the second circuit based on performing a decoding process on the stored data, where generating the error vector may be based on activating the third circuit and deactivating the second circuit.

Some examples of the method 600 and the apparatus described herein may further include operations, features, circuitry, logic, means, or instructions for activating the second circuit and deactivating a third circuit of the memory device based on performing an encoding process on the data, where generating the set of parity bits may be based on activating the second circuit and deactivating the third circuit.

Some examples of the method 600 and the apparatus described herein may further include operations, features, circuitry, logic, means, or instructions for receiving the data at the memory device via a channel coupled with a device external to the memory device and sending the data to the first circuit via a multiplexer coupled with the channel and the first circuit, where the multiplexer may be coupled with an array of memory cells of the memory device.

Some examples of the method 600 and the apparatus described herein may further include operations, features, circuitry, logic, means, or instructions for generating each of the set of multiple syndromes using a respective first matrix having a size of a first dimension by a second dimension, where the first dimension may be equal to a quantity of bits of the data plus a quantity of parity bits of the set of parity bits and the second dimension may be equal to the quantity of parity bits and generating the set of parity bits using a second matrix having a size of the second dimension by the second dimension.

It should be noted that the methods described herein describe possible implementations, and that the operations and the steps may be rearranged or otherwise modified and that other implementations are possible. Further, portions from two or more of the methods may be combined.

An apparatus is described. The apparatus may include an array of memory cells, a circuit coupled with the array of memory cells and including, a first sub circuit operable to receive data and, based on the data, generate a set of multiple syndromes associated with a cyclic error correction code operable to correct at least two errors, and a second subcircuit operable to receive the set of multiple syndromes from the first subcircuit and, based on the set of multiple syndromes, generate a set of parity bits for encoding the data.

In some examples of the apparatus, the circuit further includes a third subcircuit operable to receive the set of multiple syndromes from the first subcircuit and, based on the set of multiple syndromes, generate an error vector for decoding the data.

In some examples of the apparatus, the first subcircuit may be further operable to receive the set of parity bits from the array of memory cells and send the set of parity bits to the third subcircuit and the third subcircuit may be further operable to receive the set of parity bits from the first subcircuit and, based on the set of parity bits, generate the error vector for decoding the data.

In some examples, the apparatus may include correct one or more errors in the data based at least part on the generated error vector.

In some examples, the apparatus may include a controller operable to, activate the second subcircuit and deactivate the third subcircuit of the circuit based on performing an encoding process on the data, and activate the third subcircuit and deactivate the second subcircuit based on performing a decoding process on the data.

In some examples, the apparatus may include a channel coupled with the circuit and operable to receive the data from a device external to the apparatus for storage at the array of memory cells, where the circuit may be operable to receive the data from the channel or from the array of memory cells.

In some examples, the apparatus may include a multiplexer coupled with the channel, the array of memory cells, and the circuit, where the multiplexer may be operable to receive the data from the channel or the array of memory cells and send the data to the first subcircuit of the circuit.

In some examples of the apparatus, the first subcircuit includes a first portion of the first subcircuit operable to generate a first syndrome of the set of multiple syndromes and send the first syndrome to the second subcircuit and a second portion of the first subcircuit operable to generate a second syndrome of the set of multiple syndromes and send the second syndrome to the second subcircuit.

In some examples of the apparatus, the first subcircuit generates each of the set of multiple syndromes using a respective first matrix having a size of a first dimension by a second dimension and the second subcircuit generates the set of parity bits using a second matrix having a size of the second dimension by the second dimension, and the first dimension may be equal to a quantity of bits of the data plus a quantity of parity bits of the set of parity bits and the second dimension may be equal to the quantity of parity bits.

Another apparatus is described. The apparatus may include an array of memory cells, a first circuit coupled with the array of memory cells and operable to, receive data, generate, based on the data, a set of multiple syndromes associated with a cyclic error correction code operable to correct at least two errors, a second circuit coupled with the first circuit and with the array of memory cells, and operable to, receive the set of multiple syndromes from the first circuit based on being activated to encode the data, generate a second set of parity bits for encoding the data based on the set of multiple syndromes, a third circuit coupled with the first circuit, the third circuit operable to, receive, from the first circuit, the set of multiple syndromes and a first set of parity bits associated with the data based on being activated to decode the data, and generate an error vector for decoding the data based on the set of multiple syndromes and the first set of parity bits.

In some examples, the apparatus may include a controller operable to, activate the second circuit and deactivate the third circuit based on performing an encoding process on the data, and activate the third circuit and deactivate the second circuit based on performing a decoding process on the data.

In some examples, the apparatus may include a channel coupled with the first circuit and operable to receive the data from a device external to the apparatus for storage at the array of memory cells, where the first circuit may be operable to receive the data from the channel.

In some examples, the apparatus may include a channel coupled with the third circuit and operable to transmit the data to a device external to the apparatus based on generating the error vector.

In some examples of the apparatus, the first circuit may be operable to receive the data and the first set of parity bits from the array of memory cells based on a command received by the apparatus.

In some examples, the apparatus may include receive the second set of parity bits from the second circuit and store the data and the second set of parity bits based on receiving the second set of parity bits.

In some examples, the apparatus may include a multiplexer coupled with a channel, the array of memory cells, and the first circuit, where the multiplexer may be operable to receive the data from the channel or the array of memory cells and send the data to the first circuit.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" refers to condition of moving from an open-circuit relationship between components in which signals are not presently capable of being communicated between the components over a conductive path to a closed-circuit relationship between components in which signals are capable of being communicated between components over the conductive path. When a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components, the controller affects a change that prevents signals from flowing between the components using a conductive path that previously permitted signals to flow.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In other examples, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described herein can be implemented using software executed by a processor, hardware, firmware, hardwiring, or combinations of any of these. Features implementing functions may also be physically located at various positions, including being distributed such that portions of functions are implemented at different physical locations.

For example, the various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read-only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. An apparatus, comprising:
   an array of memory cells; and
   a circuit coupled with the array of memory cells and comprising:
   a first subcircuit operable to receive data and, based at least in part on the data, generate a plurality of syndromes associated with a cyclic error correction code operable to correct at least two errors;
   a second subcircuit operable to receive the plurality of syndromes from the first subcircuit and, based at least in part on the plurality of syndromes, generate a set of parity bits for encoding the data; and
   a third subcircuit operable to receive the plurality of syndromes from the first subcircuit and, based at least in part on the plurality of syndromes, generate an error vector for decoding the data.

2. The apparatus of claim 1, wherein:
   the first subcircuit is further operable to receive the set of parity bits from the array of memory cells and send the set of parity bits to the third subcircuit; and
   the third subcircuit is further operable to receive the set of parity bits from the first subcircuit and, based at least in part on the set of parity bits, generate the error vector for decoding the data.

3. The apparatus of claim 1, wherein the third subcircuit is further operable to:
   correct one or more errors in the data based at least part on the generated error vector.

4. The apparatus of claim 1, further comprising:
   a controller operable to:
   activate the second subcircuit and deactivate the third subcircuit of the circuit based at least in part on performing an encoding process on the data; and
   activate the third subcircuit and deactivate the second subcircuit based at least in part on performing a decoding process on the data.

5. The apparatus of claim 1, further comprising:
   a channel coupled with the circuit and operable to receive the data from a device external to the apparatus for storage at the array of memory cells, wherein the circuit is operable to receive the data from the channel or from the array of memory cells.

6. The apparatus of claim 5, further comprising:
   a multiplexer coupled with the channel, the array of memory cells, and the circuit, wherein the multiplexer is operable to receive the data from the channel or the array of memory cells and send the data to the first subcircuit of the circuit.

7. An apparatus, comprising:
   an array of memory cells; and
   a circuit coupled with the array of memory cells and comprising:
   a first subcircuit operable to receive data and, based at least in part on the data, generate a plurality of syndromes associated with a cyclic error correction code operable to correct at least two errors, wherein a first portion of the first subcircuit is operable to generate a first syndrome of the plurality of syndromes and send the first syndrome to a second subcircuit, and wherein a second portion of the first subcircuit is operable to generate a second syndrome of the plurality of syndromes and send the second syndrome to the second subcircuit; and
   the second subcircuit operable to receive the plurality of syndromes from the first subcircuit and, based at least in part on the plurality of syndromes, generate a set of parity bits for encoding the data.

8. An apparatus, comprising:
   an array of memory cells; and
   a circuit coupled with the array of memory cells and comprising:
   a first subcircuit operable to receive data and, based at least in part on the data, generate a plurality of syndromes associated with a cyclic error correction code operable to correct at least two errors, wherein the first subcircuit generates each of the plurality of syndromes using a respective first matrix having a size of a first dimension by a second dimension; and
   a second subcircuit operable to receive the plurality of syndromes from the first subcircuit and, based at least in part on the plurality of syndromes, generate a set of parity bits for encoding the data, wherein the second subcircuit generates the set of parity bits using a second matrix having a size of the second dimension by the second dimension,
   wherein the first dimension is equal to a quantity of bits of the data plus a quantity of parity bits of the set of parity bits and the second dimension is equal to the quantity of parity bits.

9. A method, comprising:
   receiving data at a memory device;
   generating, at a first circuit of the memory device and based at least in part on the data, a plurality of syndromes associated with a cyclic error correction code operable to correct at least two errors;
   generating, at a second circuit of the memory device and based at least in part on the plurality of syndromes, a set of parity bits associated with the data; and
   generating, at a third circuit of the memory device and based at least on the plurality of syndromes and the set of parity bits, an error vector for decoding the data.

10. A method, comprising:
    receiving data at a memory device;
    generating, at a first circuit of the memory device and based at least in part on the data, a plurality of syndromes associated with a cyclic error correction code operable to correct at least two errors;
    generating, at a second circuit of the memory device and based at least in part on the plurality of syndromes, a set of parity bits associated with the data;
    generating, at a third circuit of the memory device and based at least on the plurality of syndromes and the set of parity bits, an error vector for decoding the stored data;
    storing the data and the set of parity bits at a set of memory cells of the memory device based at least in part on generating the set of parity bits;
    accessing the stored data and the set of parity bits based at least in part on a command received by the memory device; and
    generating, at the first circuit of the memory device and based at least in part on the stored data, a second plurality of syndromes associated with a cyclic error correction code operable to correct at least two errors.

11. The method of claim 10, further comprising:
    correcting one or more errors in the stored data based at least part on the generated error vector.

12. The method of claim 10, further comprising:
    activating the third circuit and deactivating the second circuit based at least in part on performing a decoding process on the stored data, wherein generating the error vector is based at least in part on activating the third circuit and deactivating the second circuit.

13. A method, comprising:
receiving data at a memory device;
generating, at a first circuit of the memory device and based at least in part on the data, a plurality of syndromes associated with a cyclic error correction code operable to correct at least two errors;
generating, at a second circuit of the memory device and based at least in part on the plurality of syndromes, a set of parity bits associated with the data;
generating, at a third circuit of the memory device and based at least on the plurality of syndromes and the set of parity bits, an error vector for decoding the data; and
activating the second circuit and deactivating a third circuit of the memory device based at least in part on performing an encoding process on the data, wherein generating the set of parity bits is based at least in part on activating the second circuit and deactivating the third circuit.

14. The method of claim 9, further comprising:
receiving the data at the memory device via a channel coupled with a device external to the memory device; and
sending the data to the first circuit via a multiplexer coupled with the channel and the first circuit, wherein the multiplexer is coupled with an array of memory cells of the memory device.

15. The method of claim 9, further comprising:
generating each of the plurality of syndromes using a respective first matrix having a size of a first dimension by a second dimension, wherein the first dimension is equal to a quantity of bits of the data plus a quantity of parity bits of the set of parity bits and the second dimension is equal to the quantity of parity bits; and
generating the set of parity bits using a second matrix having a size of the second dimension by the second dimension.

16. An apparatus, comprising:
an array of memory cells;
a first circuit coupled with the array of memory cells and operable to:
receive data; and
generate, based at least in part on the data, a plurality of syndromes associated with a cyclic error correction code operable to correct at least two errors;
a second circuit coupled with the first circuit and with the array of memory cells, and operable to:
receive the plurality of syndromes from the first circuit based at least in part on being activated to encode the data; and
generate a second set of parity bits for encoding the data based at least in part on the plurality of syndromes; and
a third circuit coupled with the first circuit, the third circuit operable to:
receive, from the first circuit, the plurality of syndromes and a first set of parity bits associated with the data based at least in part on being activated to decode the data; and
generate an error vector for decoding the data based at least in part on the plurality of syndromes and the first set of parity bits.

17. The apparatus of claim 16, further comprising:
a controller operable to:
activate the second circuit and deactivate the third circuit based at least in part on performing an encoding process on the data; and
activate the third circuit and deactivate the second circuit based at least in part on performing a decoding process on the data.

18. The apparatus of claim 16, further comprising:
a channel coupled with the first circuit and operable to receive the data from a device external to the apparatus for storage at the array of memory cells, wherein the first circuit is operable to receive the data from the channel.

19. The apparatus of claim 16, further comprising:
a channel coupled with the third circuit and operable to transmit the data to a device external to the apparatus based at least in part on generating the error vector.

20. The apparatus of claim 16, wherein the first circuit is operable to receive the data and the first set of parity bits from the array of memory cells based at least in part on a command received by the apparatus.

21. The apparatus of claim 16, wherein the array of memory cells is operable to:
receive the second set of parity bits from the second circuit; and
store the data and the second set of parity bits based at least in part on receiving the second set of parity bits.

22. The apparatus of claim 16, further comprising:
a multiplexer coupled with a channel, the array of memory cells, and the first circuit, wherein the multiplexer is operable to receive the data from the channel or the array of memory cells and send the data to the first circuit.

23. An apparatus, comprising:
means for receiving data at a memory device;
means for generating, based at least in part on the data, a plurality of syndromes associated with a cyclic error correction code operable to correct at least two errors;
means for generating, based at least in part on the plurality of syndromes, a set of parity bits associated with the data; and
means for generating, based at least in part on the plurality of syndromes, an error vector for decoding the data.

* * * * *